(12) United States Patent
Li et al.

(10) Patent No.: US 9,807,893 B2
(45) Date of Patent: Oct. 31, 2017

(54) MOUNT FOR FLEXIBLE DISPLAY DEVICE AND FLEXIBLE DISPLAY DEVICE

(71) Applicant: BOE TECHNOLOGY GROUP CO., LTD., Beijing (CN)

(72) Inventors: Zhao Li, Beijing (CN); Dawei Wang, Beijing (CN)

(73) Assignee: BOE TECHNOLOGY GROUP CO., LTD., Chaoyang District, Beijing (CN)

( * ) Notice: Subject to any disclaimer, the term of this patent is extended or adjusted under 35 U.S.C. 154(b) by 0 days.

(21) Appl. No.: 15/030,589

(22) PCT Filed: Dec. 10, 2015

(86) PCT No.: PCT/CN2015/096937
§ 371 (c)(1),
(2) Date: Apr. 19, 2016

(87) PCT Pub. No.: WO2016/188085
PCT Pub. Date: Dec. 1, 2016

(65) Prior Publication Data
US 2017/0150616 A1 May 25, 2017

(30) Foreign Application Priority Data
May 25, 2015 (CN) .......................... 2015 1 0272666

(51) Int. Cl.
*H05K 5/00* (2006.01)
*G09F 9/30* (2006.01)
(Continued)

(52) U.S. Cl.
CPC ......... *H05K 5/0017* (2013.01); *G04G 17/045* (2013.01); *G06F 1/163* (2013.01);
(Continued)

(58) Field of Classification Search
CPC ..... G06F 1/163; G06F 1/1652; G04G 17/045; G04G 17/08
See application file for complete search history.

(56) References Cited

U.S. PATENT DOCUMENTS 5,896,757 A * 4/1999 Kharloubian ........ A44C 17/025
63/28
7,268,491 B2 9/2007 Aksamit et al.
(Continued)

FOREIGN PATENT DOCUMENTS

CN 101175100 A 5/2008
CN 201188642 Y 1/2009
(Continued)

OTHER PUBLICATIONS

International Search Report & Written Opinion dated Jan. 26, 2016 regarding PCT/CN2015/096937.
(Continued)

*Primary Examiner* — Adrian S Wilson
(74) *Attorney, Agent, or Firm* — Intellectual Valley Law, P.C.

(57) ABSTRACT

The present application discloses a mount for mounting a flexible display panel, comprising a flexible frame comprising a first end, a second end, and a mounting surface for receiving the flexible display panel, a first flexible arm attached to the first end of the flexible frame. The first flexible arm is movable between a first position such that the first flexible arm is substantially retracted into the flexible frame and a second position such that the first flexible arm is substantially extended from the flexible frame. When the first flexible arm is substantially extended from the flexible frame, the first flexible arm is capable of connecting to the
(Continued)

second end of the flexible frame directly or indirectly and forming a ring comprising the first flexible arm and the flexible frame.

20 Claims, 3 Drawing Sheets

(51) Int. Cl.
G06F 1/16 (2006.01)
H05K 7/14 (2006.01)
H05K 5/02 (2006.01)
H05K 1/14 (2006.01)
G04G 17/04 (2006.01)

(52) U.S. Cl.
CPC ............ *G06F 1/1652* (2013.01); *G09F 9/301* (2013.01); *H05K 1/14* (2013.01); *H05K 5/0086* (2013.01); *H05K 5/0217* (2013.01); *H05K 7/1427* (2013.01); *H05K 2201/04* (2013.01)

(56) References Cited

U.S. PATENT DOCUMENTS

| | | | |
|---|---|---|---|
| 7,710,370 | B2 | 5/2010 | Slikkerveer et al. |
| 8,001,711 | B2 | 8/2011 | LaFarre et al. |
| 8,020,327 | B2 | 9/2011 | Schellingerhout et al. |
| 8,067,802 | B2 | 11/2011 | Dekker et al. |
| 8,096,068 | B2 | 1/2012 | Van Rens |
| 8,199,471 | B2 | 6/2012 | Bemelmans et al. |
| 8,213,599 | B2 | 7/2012 | Kim et al. |
| 8,313,074 | B2 | 11/2012 | Wang |
| 8,477,250 | B2 | 7/2013 | Schellingerhout et al. |
| 2002/0105778 | A1* | 8/2002 | Harada ............... G06F 1/1601 361/679.03 |
| 2005/0237704 | A1* | 10/2005 | Ceresoli ............... G06F 1/163 361/679.03 |
| 2006/0209218 | A1* | 9/2006 | Lee ...................... G04G 9/00 349/1 |
| 2007/0064542 | A1* | 3/2007 | Fukushima ......... G04B 37/1486 368/282 |
| 2007/0205997 | A1* | 9/2007 | Lieshout ........... G02F 1/133305 345/204 |
| 2007/0279852 | A1* | 12/2007 | Daniel ................ A44C 5/0007 361/679.03 |
| 2009/0251888 | A1* | 10/2009 | Douglas ............... A44C 5/0015 362/103 |
| 2011/0187681 | A1* | 8/2011 | Kim ..................... G06F 1/1652 345/204 |
| 2012/0138647 | A1* | 6/2012 | Norling ................. A45F 5/00 224/267 |
| 2012/0314546 | A1* | 12/2012 | Brewer ................ G04G 17/04 368/281 |
| 2013/0044215 | A1* | 2/2013 | Rothkopf .............. G06F 1/163 348/143 |
| 2013/0083496 | A1* | 4/2013 | Franklin ............... G06F 1/1626 361/749 |
| 2013/0108907 | A1* | 5/2013 | Bhardwaj ......... H01M 10/0431 429/94 |
| 2013/0120106 | A1* | 5/2013 | Cauwels ................ G06F 1/163 340/3.1 |
| 2013/0235008 | A1* | 9/2013 | Kwon ..................... G09G 3/20 345/204 |
| 2014/0028546 | A1* | 1/2014 | Jeon ...................... G06F 3/014 345/156 |
| 2014/0218852 | A1* | 8/2014 | Alcazar ................. G06F 1/163 361/679.03 |
| 2014/0295918 | A1* | 10/2014 | Grifoni ............... H04M 1/7253 455/566 |
| 2014/0307395 | A1 | 10/2014 | An |
| 2015/0116125 | A1* | 4/2015 | Armstrong ........... A61B 5/0456 340/870.01 |

FOREIGN PATENT DOCUMENTS

| | | |
|---|---|---|
| CN | 201348749 Y | 11/2009 |
| CN | 101685581 A | 3/2010 |
| CN | 1973240 B | 12/2010 |
| CN | 101995727 A | 3/2011 |
| CN | 102026743 A | 4/2011 |
| CN | 102043444 A | 5/2011 |
| CN | 102239683 A | 11/2011 |
| CN | 203149296 U | 8/2013 |
| CN | 103458083 A | 12/2013 |
| CN | 104299524 A | 1/2015 |
| CN | 204178148 U | 2/2015 |
| CN | 104821975 A | 8/2015 |
| EP | 2698686 A2 | 2/2014 |
| WO | 2015031426 A1 | 3/2015 |

OTHER PUBLICATIONS

The First Office Action in the Chinese Patent Application No. 201510272666.7, dated Mar. 22, 2017; English translation attached.

* cited by examiner

MOUNT FOR FLEXIBLE DISPLAY DEVICE AND FLEXIBLE DISPLAY DEVICE

CROSS-REFERENCE TO RELATED APPLICATION

This application is a national stage application under 35 U.S.C. §371 of International Application No. PCT/CN2015/096937 filed Dec. 10, 2015, which claims priority to Chinese Patent Application No. 201510272666.7, filed May 25, 2015, the contents of which are incorporated by reference in the entirety.

FIELD

The present invention relates to display technology, particularly to a mount for flexible display device and a flexible display device.

BACKGROUND

Flexible display panel and rollable display panel have been proposed and researched for design and other reasons. The flexible display panel and rollable display panel can be folded or rolled up into a roll thereby reduce the overall size thereof. The flexible display panel and rollable display panel are susceptible to damages caused by stress or nicks. In general, a flexible or rollable display panel is provided in a case or on a support.

SUMMARY

The present invention provides a mount for mounting a flexible display panel, comprising a flexible frame comprising a first end, a second end, and a mounting surface for receiving the flexible display panel; and a first flexible arm attached to the first end of the flexible frame, wherein the first flexible arm is movable between a first position such that the first flexible arm is substantially retracted into the flexible frame and a second position such that the first flexible arm is substantially extended from the flexible frame; wherein, when the first flexible arm is substantially extended from the flexible frame, the first flexible arm is capable of connecting to the second end of the flexible frame directly or indirectly and forming a ring comprising the first flexible arm and the flexible frame.

Optionally, the flexible frame further comprises a slot for receiving a flexible battery. Optionally, the mount further comprises a flexible battery. Optionally, the mount further comprises a printed circuit board. Optionally, the printed circuit board is a flexible printed circuit board. Optionally, the first flexible arm comprises a first flexible slide slidably attached to the first end of the flexible frame, the flexible frame comprises a first pair of guide units, the first flexible slide comprises a first pair of slide rails, and the first pair of guide units and the first pair of slide rails cooperate with each other to permit sliding movement of the first flexible slide relative to the flexible frame along the sliding direction. Optionally, the mount further comprises a second flexible arm attached to the second end of the flexible frame, wherein the second flexible arm is movable between a third position such that the second flexible arm is substantially retracted into the flexible frame and a fourth position such that the second flexible arm is substantially extended from the flexible frame; wherein, when at least one of the first and second arms are substantially extended from the flexible frame, the first flexible arm and the second flexible arm are capable of connecting to each other and forming a ring comprising the flexible frame, the first flexible arm and the second flexible arm. Optionally, the second flexible arm comprises a second flexible slide slidably attached to the second end of the flexible frame, the flexible frame comprises a second pair of guide units, the second flexible slide comprises a second pair of slide rails, and the second pair of guide units and the second pair of slide rails cooperate with each other to permit sliding movement of the second flexible slide relative to the flexible frame along the sliding direction. Optionally, the mount further comprises a case for receiving the printed circuit board, disposed between the pair of slide rails of the first flexible slide or the second flexible slide. Optionally, the movement of the first flexible arm or the second flexible arm can be locked at a predetermined position wherein the first flexible arm or the second flexible arm is restricted in movement relative to the flexible frame. Optionally, the first or second flexible arm comprises a positioning post, and the flexible frame comprises a positioning groove, the positioning post is capable of engaging the corresponding positioning groove so that the first flexible arm or the second flexible arm can be locked at the predetermined position. Optionally, the flexible frame and the first flexible arm are made of a memory alloy or a flexible plastic. Optionally, the mount further comprises a third flexible slide slidably attached to the first flexible slide, wherein the third flexible slide is slidable between a fifth position such that the third flexible slide is substantially retracted into the first flexible slide and a sixth position such that the third flexible slide is substantially extended from the first flexible slide; wherein, when the third flexible slide is substantially extended from the first flexible slide, the third flexible slide is capable of connecting to the flexible frame directly or indirectly and forming a ring comprising the flexible frame, the first flexible slide and the third flexible slide. Optionally, the mount further comprises a fourth flexible slide slidably attached to the second flexible slide, wherein the fourth flexible slide is slidable between a seventh position such that the fourth flexible slide is substantially retracted into the second flexible slide and a eighth position such that the fourth flexible slide is substantially extended from the second flexible slide; wherein, when the fourth flexible slide is substantially extended from the second flexible slide, the fourth flexible slide and the fourth flexible slide are capable of connecting to each other and forming a ring comprising the flexible frame, the first flexible slide, the third flexible slide. Optionally, the mount is rollable. Optionally, the mount is wrapped around a user's wrist when in use.

The present invention also provides a flexible display device comprising a flexible display panel mounted to a flexible mount as described herein. Optionally, the flexible display panel and the printed circuit board are connected wirelessly. Optionally, the printed circuit board is a flexible printed circuit board connected to the flexible display panel via a wired connection, one end of the flexible printed circuit is secured to the back of the flexible display panel, and the other end is connected to the case for receiving the flexible printed circuit board disposed between the pair of slide rails of the first flexible slide or the second flexible slide. Optionally, the flexible display device further comprises a connector strip attached to the flexible printed circuit board, wherein the connector strip is shorter in length than the flexible printed circuit board.

BRIEF DESCRIPTION OF THE FIGURES

The following drawings are merely examples for illustrative purposes according to various disclosed embodiments and are not intended to limit the scope of the present invention.

DETAILED DESCRIPTION OF THE EMBODIMENTS

The disclosure will now describe more specifically with reference to the following embodiments. It is to be noted that the following descriptions of preferred embodiments are presented herein for purpose of illustration and description only. It is not intended to be exhaustive or to be limited to the precise form disclosed.

Figure 1A:
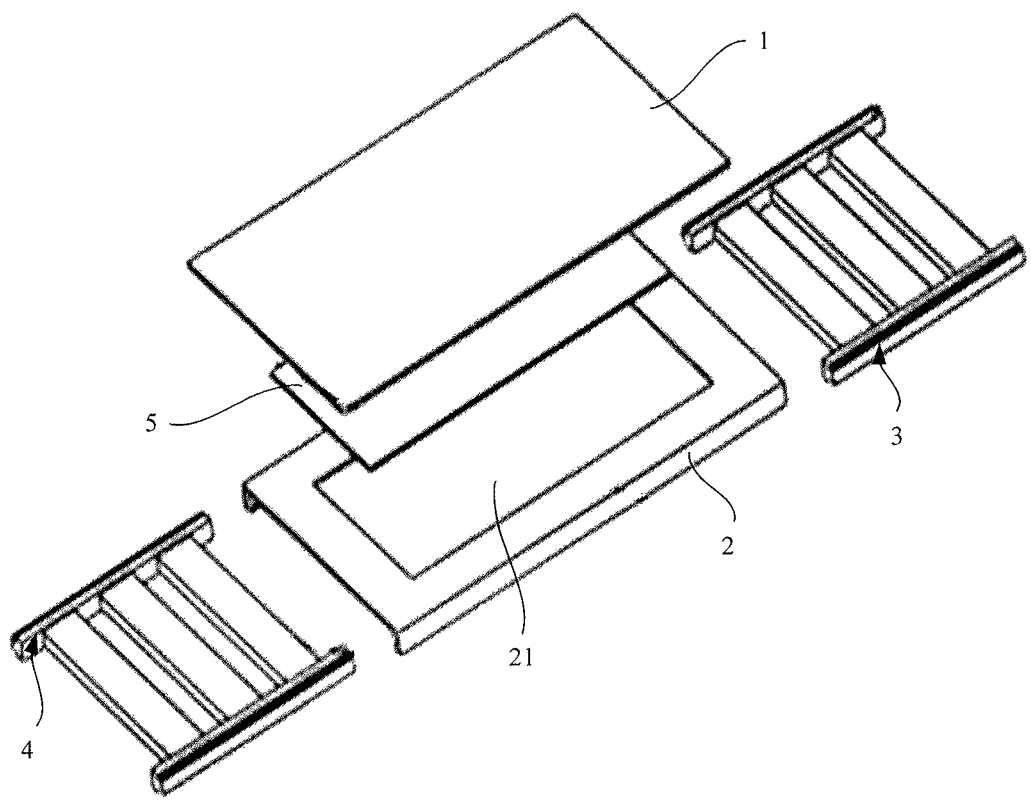
FIG. 1a is an exploded schematic view showing the structure of a flexible display device in one embodiment.
Figure 1B:
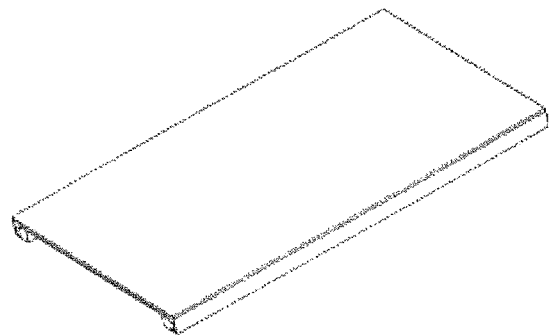
FIG. 1b is a schematic view showing the structure of a flexible display device of FIG. 1a wherein the flexible slides are retracted into the flexible frame.

FIG. 1a is an exploded schematic view showing the structure of a flexible display device in one embodiment. Referring to FIG. 1, the flexible display device in the embodiment includes a flexible display panel 1 and a mount for mounting the flexible display panel. The mount of the embodiment is a flexible mount capable of deforming to form a ring shape structure. Specifically, the mount in the embodiment includes a flexible frame 2 for mounting a flexible display panel and a first flexible arm 3 attached to the flexible frame 2. The flexible frame 2 includes a first end, a second end, and a mounting surface for receiving the flexible display panel 1. The first flexible arm 3 can be attached to the first end of the flexible frame 2 in various ways so long as the first flexible slide 3 can be retracted into and extended from the flexible frame 2. In the embodiment as shown in FIG. 1a, the first flexible arm 3 is a flexible slide slidably attached to the flexible frame 2. The first flexible arm 3 may be slidable between a first position (as shown in FIG. 1b) such that the first flexible arm 3 is substantially retracted into the flexible frame 2 and a second position (as shown in FIG. 1a and FIG. 1c) such that the first flexible arm 3 is substantially extended from the flexible frame 2.

Figure 1C:
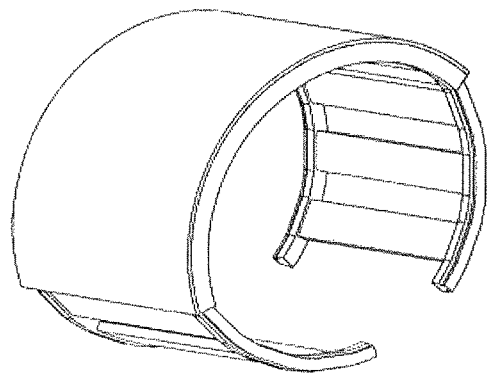
FIG. 1c is a schematic view showing the structure of a flexible display device of FIG. 1a wherein the flexible slides are extended from the flexible frame and form a ring structure.

Referring to FIG. 1c, when the first flexible arm 3 in the embodiment is substantially extended from the flexible frame 2, the first flexible arm 3 is capable of connecting to the flexible frame 2 directly or indirectly and forming a ring comprising the first flexible slide 3 and the flexible frame 2. The first flexible arm 3 may be connected to the flexible frame 2, directly or indirectly, through various mechanisms, e.g., a chain, a latch, a belt, a clip-on, a button, etc.

Referring to FIG. 1a, the mount in the embodiment can further include a second flexible arm 4 attached to the flexible frame 2. The second flexible arm 4 can be attached to the flexible frame 2 in various ways as long as the second flexible arm 4 can be retracted into and extended from the flexible frame 2. In the embodiment as shown in FIG. 1a, the second flexible arm 4 is a flexible slide slidably attached to the flexible frame 2. The second flexible arm 4 may be slidable between a third position (as shown in FIG. 1b) such that the second flexible arm 4 is substantially retracted into the flexible frame 2 and a fourth position (as shown in FIG. 1a and FIG. 1c) such that the second flexible arm 4 is substantially extended from the flexible frame 2. Optionally, the first flexible arm 3 and the second flexible arm 4 can be extended from the first end and the second end of the flexible frame 2, respectively.

Referring to FIG. 1c, when at least one of the first flexible arm 3 and the second flexible arm 4 are substantially extended from the flexible frame 2, the first flexible arm 3 and the second flexible arm 4 are capable of connecting to each other and forming a ring comprising the flexible frame 2, the first flexible arm 3 and the second flexible arm 4. The first flexible arm 3 may be connected to the second flexible arm 4 through various mechanisms, e.g., a chain, a latch, a belt, a clip-on, a button, etc.

Accordingly, the flexible display device in the embodiment is capable of undergoing deformation from a first configuration, e.g., a flat configuration to a second configuration, e.g., a curved, a rolled-up, a folded up, or a ring configuration. The flexible display device in the embodiment is portable when the flexible arms 3 and 4 are retracted into the flexible frame 2, and is wearable when the flexible arms 3 and 4 are extended from the flexible frame 2. For example, the flexible display device can be wrapped around a user's wrist or a bike handlebar or a treadmill handle bar, or attached to a sleeve, an eyewear such as a google, or other types of garments. The second configuration is not limited to a ring structure. Depending on the purpose of use, the flexible display device can take other types of configurations. For example, when the flexible display device is wrapped around a user's wrist, the flexible display device is deformed to form a ring comprising the flexible frame 2, the first flexible arm 3, and the second flexible arm 4. In some embodiments, the ring is a closed or unbroken ring. When the flexible display device is attached to an eyewear or a garment, it can be deformed to form a half-ring structure. Optionally the ends of the flexible arms can be attached to a target object, e.g., a google or a sleeve. It can also be folded into a multi-angle display panel so that multiple users can view the device from several angles. The flexible display device can also be rolled up into a roll. Therefore, the flexible display device is optionally a rollable display device. The flexible display device does not require a signal from a processor for switching between two configurations.

As used herein, the term "ring" or "ring structure" refers to a structure or portion of a structure having a hole therethrough, including but not limited to a ring or doughnut shape. A ring structure may be essentially round like a doughnut, or may be formed of a square, triangle or another shape with a hole therethrough. As used herein, a ring structure does not require that the ring shape be unbroken, and the term is intended to encompass structures that are substantially closed, but that comprise a break or a gap in the ring shape. The term encompasses structures that comprise cavity, e.g., a "C" and "U"-shaped cavity, for receiving a body part, and that are configured to form a stable grip or hold on body part such as a wrist. A ring structure may consist essentially of a single ring, or it may be a component of a larger structure having additional features, e.g., additional ring structures, or non-ring-shaped features such as corners, points, strings, etc.

Figure 2:
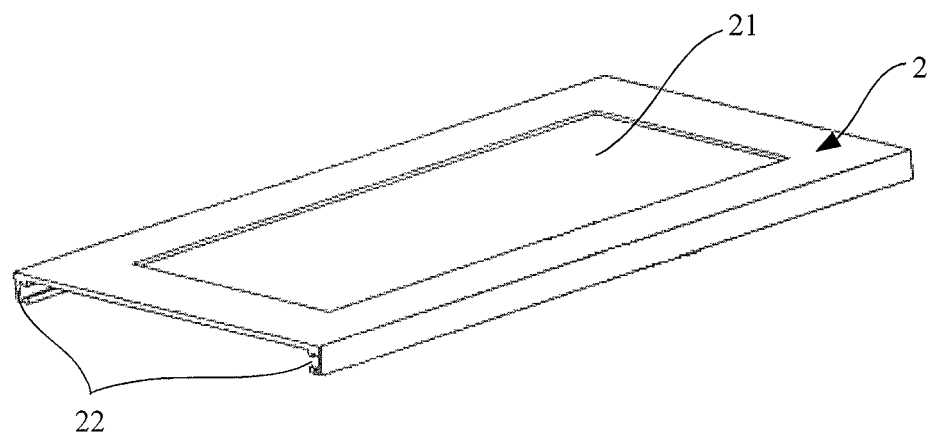
FIG. 2 is a schematic view showing the structure of a flexible frame in one embodiment.
Figure 3:
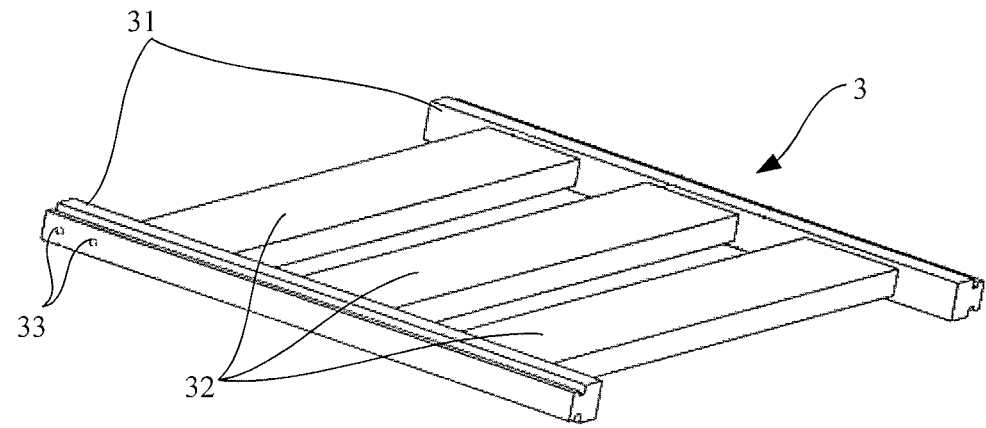
FIG. 3 is a schematic view showing the structure of a first flexible slide in one embodiment.

Referring to FIG. 2 and FIG. 3, the flexible frame 2 in the embodiment includes a first pair of guide units 22. The first flexible arm 3 is a first flexible slide slidably attached to the first end of the flexible frame. The first flexible arm 3 includes a first pair of slide rails 31. The first pair of guide units 22 and the first pair of slide rails 31 cooperate with each other to permit sliding movement of the first flexible slide 3 relative to the flexible frame 2 along the sliding direction. Similarly, the second flexible arm 4 may be a second flexible slide slidably attached to the second end of the flexible frame. The second flexible arm 4 may include a second pair of slide rails, and the flexible frame 2 may include a second pair of guide units. The second pair of guide units and the second pair of slide rails may cooperate with each other to permit sliding movement of the second flexible slide relative to the flexible frame along the sliding direction. The first pair of guide units 22 can be separated from or connected to the second pair of guide units. In the embodiment shown in FIG. 2, the second pair of guide units are connected to the first pair of guide units 22. The flexible display panel 1 can be mounted on the mounting surface of the flexible frame 2. When the first flexible arm 3 and the second flexible arm 4 are retracted into the flexible frame 2, they can be disposed on the opposite side of the mounting surface.

Referring to FIG. 1 and FIG. 2, the flexible display device in the embodiment can further include a flexible battery 5, and the flexible frame 2 can further comprise a slot 21 for receiving the flexible battery 5. When stacked together, the flexible display panel 1, the battery 5 and the flexible frame 2 form a sandwich structure with the battery 5 in the middle. The depth of the slot 21 can be designed to be substantially the same as the thickness of the battery 5 so that, when put together, the surface of the flexible display panel 1 will be in close contact with the mounting surface of the flexible frame 2 and the surface of the battery 5. Alternately, the battery 5 and the slot 21 can be disposed in other suitable locations, for example, on the side of the display panel mounting surface. The flexible display panel 1 can be secured to the flexible frame 2 by any suitable means, for example, a screw, a glue, etc.

Figure 5:
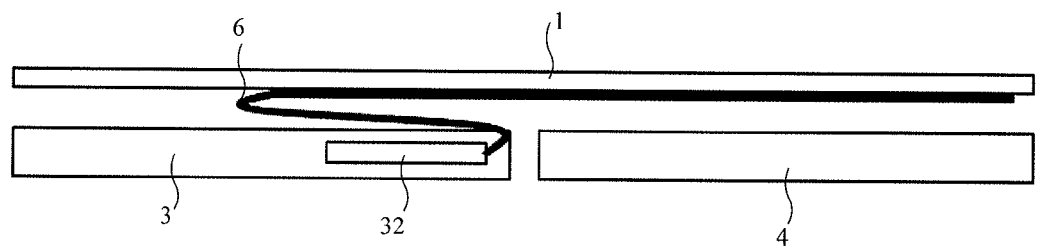
FIG. 5 is a schematic side view showing the structure of a flexible display device in another embodiment wherein the flexible slides are retracted into the flexible frame.
Figure 6:
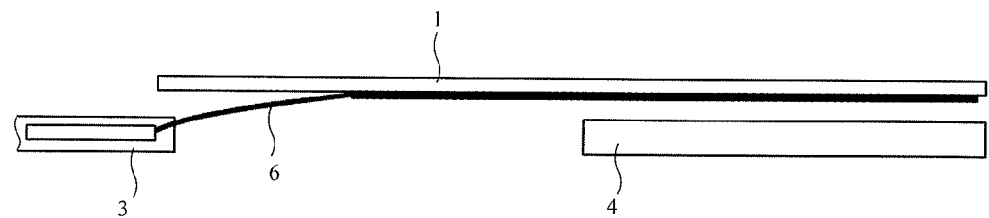
FIG. 6 is a schematic side view showing the structure of a flexible display device in another embodiment wherein the first flexible slide is extended from the flexible frame.

Referring to FIG. 3, FIG. 5, and FIG. 6, the mount in the embodiment can further include a printed circuit board and a corresponding receptacle for receiving the printed circuit board. They can be disposed in any suitable portions of the flexible display device. For example, the flexible frame 2 may include another slot for receiving the printed circuit board. In the embodiment as shown in FIG. 3, the flexible frame 2 includes a case 32 for receiving the printed circuit board, disposed between the pair of slide rails 31 of the first flexible arm 3. Similarly, the case 32 for receiving the printed circuit board can also be disposed between the second pair of slide rails of the second flexible arm 4. Optionally, the pair of slide rails are parallel to each other.

The printed circuit board and the flexible display panel 1 can be connected wirelessly or via a wired connection. When the printed circuit board is disposed in the case 32 and connected to the flexible display panel 1 wirelessly, the printed circuit board can be either a flexible printed circuit board 6 or a regular printed circuit board of a small size. In the embodiments as shown in FIG. 5 and FIG. 6, the flexible display device includes a flexible printed circuit board 6 connected to the flexible display panel 1 via a wired connection. One end of the flexible printed circuit board 6 is secured to the back of the flexible display panel. The other end is connected to the first flexible arm 3 (or the second flexible arm 4 or both), e.g., via the case 32. As shown in FIG. 5, when the first flexible arm 3 is retracted into the flexible frame 2, the flexible printed circuit board 6 is also retracted into the flexible frame 2 in a folded form. As shown in FIG. 6, when the first flexible arm 3 is extended from the flexible frame 2, the flexible printed circuit board 6 is in an extended form.

To protect the flexible printed circuit board 6 from mechanical damage such as abrasion, tension, bending, shear, and compression, the flexible display device can further include a connector strip attached to the flexible printed circuit board 6. The connector strip can be wrapped around the flexible printed circuit board 6 to protect it from abrasion and shear when the flexible arm 3 or 4 moves along the sliding direction. The connector strip can be shorter in length than the flexible printed circuit board 6. When the flexible slide 3 or 4 is extended from the flexible frame 2, the connector strip would be stretched first before the flexible printed circuit board 6 gets stretched. The tension on the flexible printed circuit board 6 is reduced by this mechanism.

Referring to FIG. 3, the first flexible slide 3 in the embodiment includes a stopper device to set the limit for how far the first flexible arm 3 can extend away from the flexible frame 2. For example, the stopper device can designed so that the first flexible arm 3 cannot extend over the second position. Similarly, the second flexible arm 4 can also include a stopper device to set the limit for how far the second flexible arm 4 can extend away from the flexible frame 2. For example, the stopper device can designed so that the second flexible arm 4 cannot extend over the fourth position.

The stopper device can also lock the sliding movement of the first flexible arm 3 or the second flexible arm 4 at a predetermined position so that the first flexible arm 3 or the second flexible arm 4 is restricted in movement relative to the flexible frame 2. Referring to FIG. 3, the first flexible arm 3 in the embodiment includes one or more positioning posts 33 and the flexible frame 2 includes one or more positioning grooves. Similarly, the second flexible arm 4 in the embodiment can also include one or more positioning posts. The positioning post is capable of engaging the corresponding positioning groove so that the first flexible arm 3 or the second flexible arm 4 can be locked at the predetermined position.

Figure 4:
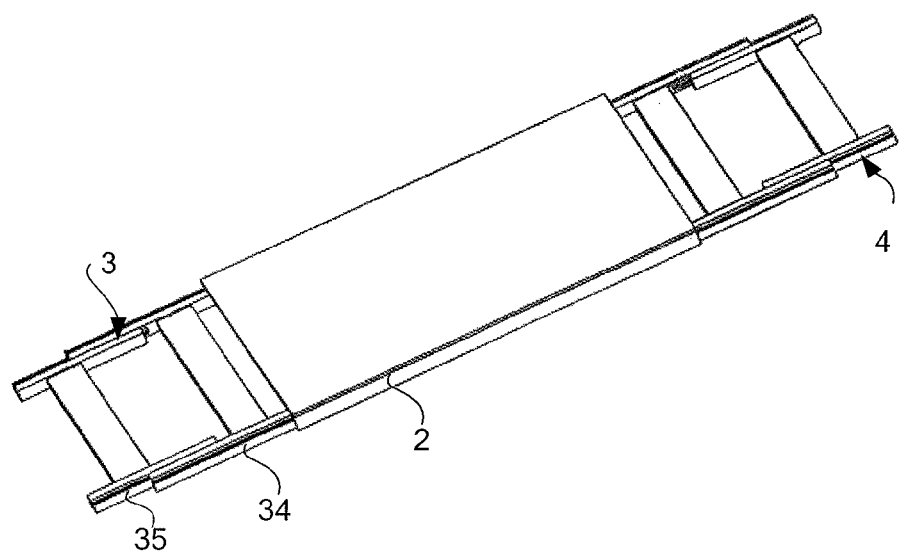
FIG. 4 is a schematic view showing the structure of a flexible display device in another embodiment.

Referring to FIG. 4, the flexible display device in the embodiment can further include a third flexible arm 35 or a fourth flexible arm. As shown in FIG. 4, the flexible display device in the embodiment includes a first flexible arm 34 and a third flexible arm 35. The first flexible arm 34 and the third flexible arm 35 in the embodiment are both flexible slides, a first flexible slide 34 and a third flexible slide 35. The third flexible slide 35 is slidably attached to the first flexible slide 34. The third flexible slide 35 is slidable between a fifth position such that the third flexible slide 35 is substantially retracted into the first flexible slide 34 and a sixth position such that the third flexible slide 35 is substantially extended from the first flexible slide 34. When the third flexible slide 35 is substantially extended from the first flexible slide 34, the third flexible slide 35 is capable of connecting to the flexible frame 2 directly or indirectly and forming a ring comprising the flexible frame 2, the first flexible slide 34 and the third flexible slide 35. Similarly, the flexible display device can further include a fourth flexible slide slidably attached to the second flexible slide 4. The fourth flexible slide is slidable between a seventh position such that the fourth flexible slide is substantially retracted into the second flexible slide 4 and a eighth position such that the fourth flexible slide is substantially extended from the second flexible slide 4. In some embodiments, when the third flexible slide 35 and the fourth flexible slide are substantially extended from the first flexible slide 34 and the second flexible slide 4. The third flexible slide 35 and the fourth flexible slide are capable of connecting to each other and forming a ring comprising the flexible frame 2, the first flexible slide 3, the third flexible slide 35, the second flexible slide 4, and the fourth flexible slide. Additional slides can be included in the flexible display device.

The flexible components of the flexible display device, such as the flexible frame 2, the first flexible arm 3, and the second flexible arm 4, can be made of various resilient materials such as a memory alloy, a flexible plastic, an elastic memory plastic, an elastic rubber, or a combination thereof.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A mount for mounting a flexible display panel, comprising:
    a flexible frame comprising a first end, a second end, and a mounting surface for receiving the flexible display panel;
    a first flexible arm attached to the first end of the flexible frame, wherein the first flexible arm is movable between a first position such that the first flexible arm is substantially retracted into the flexible frame and a second position such that the first flexible arm is substantially extended from the flexible frame; and
    a second flexible arm attached to the second end of the flexible frame, wherein the second flexible arm is movable between a third position such that the second flexible arm is substantially retracted into the flexible frame and a fourth position such that the second flexible arm is substantially extended from the flexible frame;
    wherein, when at least one of the first and second arms are substantially extended from the flexible frame, the first flexible arm and the second flexible arm are capable of connecting to each other and forming a ring comprising the flexible frame, the first flexible arm and the second flexible arm.

2. The mount of claim 1, wherein the flexible frame further comprises a slot for receiving a flexible battery.

3. The mount of claim 1, further comprising a flexible battery.

4. The mount of claim 1, further comprising a printed circuit board.

5. The mount of claim 4, wherein the printed circuit board is a flexible printed circuit board.

6. A mount for mounting a flexible display panel, comprising:
    a flexible frame comprising a first end, a second end, and a mounting surface for receiving the flexible display panel; and
    a first flexible arm attached to the first end of the flexible frame, wherein the first flexible arm is movable between a first position such that the first flexible arm is substantially retracted into the flexible frame and a second position such that the first flexible arm is substantially extended from the flexible frame;
    wherein, when the first flexible arm is substantially extended from the flexible frame, the first flexible arm is capable of connecting to the second end of the flexible frame directly or indirectly and forming a ring comprising the first flexible arm and the flexible frame; and
    the first flexible arm comprises a first flexible slide slidably attached to the first end of the flexible frame, the flexible frame comprises a first pair of guide units, the first flexible slide comprises a first pair of slide rails, and the first pair of guide units and the first pair of slide rails cooperate with each other to permit sliding movement of the first flexible slide relative to the flexible frame along the sliding direction.

7. The mount of claim 1, wherein the second flexible arm comprises a second flexible slide slidably attached to the second end of the flexible frame, the flexible frame comprises a second pair of guide units, the second flexible slide comprises a second pair of slide rails, and the second pair of guide units and the second pair of slide rails cooperate with each other to permit sliding movement of the second flexible slide relative to the flexible frame along the sliding direction.

8. The mount of claim 7, further comprising a case for receiving the printed circuit board, disposed between the pair of slide rails of the first flexible slide or the second flexible slide.

9. The mount of claim 1, wherein the movement of the first flexible arm or the second flexible arm can be locked at a predetermined position wherein the first flexible arm or the second flexible arm is restricted in movement relative to the flexible frame.

10. The mount of claim 9, wherein the first or second flexible arm comprises a positioning post, and the flexible frame comprises a positioning groove, the positioning post is capable of engaging the corresponding positioning groove so that the first flexible arm or the second flexible arm can be locked at the predetermined position.

11. The mount of claim 1, wherein the flexible frame and the first flexible arm are made of a memory alloy or a flexible plastic.

12. The mount of claim 6, further comprising a third flexible slide slidably attached to the first flexible slide, wherein the third flexible slide is slidable between a fifth position such that the third flexible slide is substantially retracted into the first flexible slide and a sixth position such that the third flexible slide is substantially extended from the first flexible slide;
   wherein, when the third flexible slide is substantially extended from the first flexible slide, the third flexible slide is capable of connecting to the flexible frame directly or indirectly and forming a ring comprising the flexible frame, the first flexible slide and the third flexible slide.

13. The mount of claim 7, further comprising a fourth flexible slide slidably attached to the second flexible slide, wherein the fourth flexible slide is slidable between a seventh position such that the fourth flexible slide is substantially retracted into the second flexible slide and a eighth position such that the fourth flexible slide is substantially extended from the second flexible slide;
   wherein, when the fourth flexible slide is substantially extended from the second flexible slide, the fourth flexible slide and the fourth flexible slide are capable of connecting to each other and forming a ring comprising the flexible frame, the first flexible slide, the third flexible slide.

14. The mount of claim 1, wherein the mount is rollable.

15. The mount of claim 1, wherein the mount is wrapped around a user's wrist when in use.

16. A flexible display device comprising a flexible display panel mounted to a flexible mount according to claim 1.

17. The flexible display device of claim 16, wherein the flexible display panel and the printed circuit board are connected wirelessly.

18. The flexible display device of claim 16, wherein the printed circuit board is a flexible printed circuit board connected to the flexible display panel via a wired connection, one end of the flexible printed circuit is secured to the back of the flexible display panel, and the other end is connected to the case for receiving the flexible printed circuit board disposed between the pair of slide rails of the first flexible slide or the second flexible slide.

19. The flexible display device of claim 18, further comprising a connector strip attached to the flexible printed circuit board, wherein the connector strip is shorter in length than the flexible printed circuit board.

20. A flexible display device comprising a flexible display panel mounted to a flexible mount according to claim 6.

* * * * *